United States Patent
Wu et al.

(10) Patent No.: US 9,184,308 B1
(45) Date of Patent: Nov. 10, 2015

(54) DEVICES HAVING NANOSCALE STRUCTURES AND METHODS FOR MAKING SAME

(71) Applicants: I-Tsang Wu, Tampa, FL (US); Jing Wang, Tampa, FL (US)

(72) Inventors: I-Tsang Wu, Tampa, FL (US); Jing Wang, Tampa, FL (US)

(73) Assignee: Univerity of South Florida, Tampa, FL (US)

( * ) Notice: Subject to any disclaimer, the term of this patent is extended or adjusted under 35 U.S.C. 154(b) by 4 days.

(21) Appl. No.: 14/032,614

(22) Filed: Sep. 20, 2013

Related U.S. Application Data (60) Provisional application No. 61/703,537, filed on Sep. 20, 2012.

(51) Int. Cl.
*H01L 21/336* (2006.01)
*H01L 29/88* (2006.01)
*H01L 29/66* (2006.01)

(52) U.S. Cl.
CPC .......... *H01L 29/88* (2013.01); *H01L 29/66151* (2013.01)

(58) Field of Classification Search
CPC .............. H01L 21/76898; H01L 28/20; H01L 21/76224; H01L 21/76807; H01L 45/122
USPC .......... 257/301, 649; 438/382, 381, 424, 386
See application file for complete search history.

(56) References Cited

U.S. PATENT DOCUMENTS

| | | | | |
|---|---|---|---|---|
| 5,275,974 | A * | 1/1994 | Ellul et al. | 438/386 |
| 5,316,978 | A * | 5/1994 | Boyd et al. | 438/382 |
| 6,734,090 | B2 * | 5/2004 | Agarwala et al. | 438/598 |
| 2003/0181011 | A1 * | 9/2003 | Curro et al. | 438/270 |
| 2011/0220861 | A1 * | 9/2011 | Himeno et al. | 257/4 |
| 2014/0034897 | A1 * | 2/2014 | Tan et al. | 257/4 |

OTHER PUBLICATIONS

Wu, et al., "Fabrication of Thin-Film Nano-Scale Metal-Insulator-Metal (MIM) Tunnel Diode Using Conventional Photolithography", American Scientific Publishers; Nanosceience ane Nanotechnology Letters, vol. 2, 144-149, 2010.

* cited by examiner

*Primary Examiner* — Jaehwan Oh

(74) *Attorney, Agent, or Firm* — Thomas | Horstemeyer, LLP (57) ABSTRACT

In one embodiment, devices, such as metal-insulator-metal tunneling diodes, are fabricated by forming a cavity in a substrate having a top surface, conformally depositing a thin film of material in the cavity so as to form a thin layer of material on walls of the cavity, and depositing a layer of material to fill the cavity, wherein a top edge of the thin film is exposed and is flush with the top surface of the substrate.

17 Claims, 6 Drawing Sheets

DEVICES HAVING NANOSCALE STRUCTURES AND METHODS FOR MAKING SAME

CROSS-REFERENCE TO RELATED APPLICATION(S)

This application claims priority to U.S. Provisional Application Ser. No. 61/703,537, filed Sep. 20, 2012, which is hereby incorporated by reference herein in its entirety.

BACKGROUND

A tunneling diode is a type of semiconductor diode that is capable of femtosecond operation. This fast operation is made possible by the use of the quantum mechanical effect called tunneling. Metal-insulator-metal (MIM) tunneling diodes are micro-scale or nano-scale devices that include a very thin layer comprising one or more dielectric materials that is sandwiched between two metal electrodes having different work functions.

MIM tunneling diodes having a response time of less than a picosecond hold great promise to outperform their semiconductor counterparts (e.g., Schottky diodes) in mixing and detection of terahertz and infrared radiation. The most significant limitation on the speed of operation of an MIM tunneling diode is its junction capacitance. To a large extent, the junction capacitance of such a diode is determined by the size of the tunnel junction. Therefore, one method of reducing the capacitance of an MIM tunneling diode is to reduce the size of the diode's junction.

To achieve a response time in the femotosecond range, the junction needs to have a nanoscale size, in which case the area of the junction must be on the order of 0.01 μm². While such small junction sizes have been achieved using e-beam lithography, e-beam lithography is a slow "direct-write" nanolithography method that is not suitable for low-cost, high-volume, production. In order to be able to manufacture MIM tunneling diodes in a commercial context, an alternative fabrication method is required.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, in order for metal-insulator-metal (MIM) tunneling diodes to have response times of less than a picosecond, the junctions of the diodes need to have a nanoscale size. While such small sizes can be achieved using relatively slow techniques, such as e-beam lithography, alternative fabrication methods are required if such diodes are to be mass-produced in a commercial setting. Disclosed herein are methods with which an MIM tunneling diode capable of very short response times can be fabricated using conventional lithography techniques that are suitable for mass-production. In some embodiments, a bottom electrode of the diode can be created by forming a cavity in a substrate, conformally depositing metal on the substrate and in the cavity to form a thin film of metal on the walls of the cavity, depositing an isolation layer of material that covers the metal and fills the cavity, and planarizing the isolation layer to expose the top edges of the thin film formed on the cavity walls. The exposed lengths of the thin film can then be used as the bottom electrode of one or more MIM tunneling diodes. Notably, a similar process can be used to form a high aspect ratio vertical structure made of any thin-film depositable material for use in fabricating substantially any other device. Accordingly, the disclosed fabrication method is not limited to the fabrication of tunneling diodes. For instance, it could be used to form a nanoscale capacitive gap in a parallel plate capacitor that is filled with a chosen high-k insulator.

In the following disclosure, various specific embodiments are described. It is to be understood that those embodiments are example implementations of the disclosed inventions and that alternative embodiments are possible. All such embodiments are intended to fall within the scope of this disclosure.

As described above, an MIM tunneling diode comprises two metal electrodes with different work functions, which are separated by a very thin dielectric layer. In some cases, the dielectric layer can include a stack of multiple layers of insulator materials. For example, the dielectric layer can comprise two insulator layers, in which case the device can be referred to as a metal-insulator-insulator-metal (MIIM) tunneling diode. As used herein, the term "MIM tunneling diode" is an inclusive term that refers to any tunneling diode having metal electrodes and a dielectric layer that includes one or more layers of insulator materials. Therefore, as used herein, the term "MIM tunneling diode" includes MIIM tunneling diodes, MIIIM tunneling diodes, and so forth.

The MIM tunneling diode is a quantum device that relies on direct electron tunneling through the dielectric layer. The main design aspects for THz MIM tunneling diodes are the thickness and area of the tunnel junction.

One application for a THz MIM tunneling diode is to create a THz/infrared detector by coupling the diode with an antenna. The cutoff frequency ($f_c$) for the antenna-coupled MIM diode detector is given by:

$$f_c = \frac{1}{2\pi R_A C_D} \qquad \text{[Equation 1]}$$

where $C_D$ is the junction capacitance and $R_A$ is the resistance of the antenna. Reducing the MIM diode's junction area minimizes the capacitance while still maintaining the diode's electron tunneling probability. To have a cut-off frequency higher than 28 THz, a junction area of less than 0.01 μm² (e.g., 100 nm×100 nm) is required. In such a case, the resulting junction capacitance is on the order of 0.1 fF.

Inside the tunnel junction, there are three major electron tunneling mechanisms: (1) photon-assisted, (2) thermal-assisted, and (3) field-assisted tunneling. Both photon- and thermal-assisted tunneling are bias voltage dependent, while photon-assisted tunneling is junction area dependent as well. Field-assisted tunneling is the primary tunneling mechanism for THz MIM diodes. The other two tunneling effects are regarded as noise, which deteriorates the diode's performance. By reducing the size of the junction area, the negative impact of thermal- and photon-assisted tunneling is reduced, while field-assisted tunneling is improved. The utilization of a very small junction area also enhances the nonlinearity and asymmetry of the diode's response. The nonlinearity and asymmetry of an MIM tunneling diode with a junction area of 100 nm×100 nm closely resembles the behavior of an ideal diode (as shown in FIG. 6).

As described above, most of prior efforts in this area have relied upon e-beam lithography to achieve nanoscale junction sizes. However, e-beam lithography is fairly limited from the fabrication perspective because it is slow and non-repeatable. In general, e-beam lithography is not ideal for mass production, especially when the design of the tunneling diode is very material-centric. Disclosed herein are alternative fabrication methods that can be used in a mass-production context. These methods do not require e-beam lithography and instead can be performed using conventional lithographic processes.

Figure 1A:
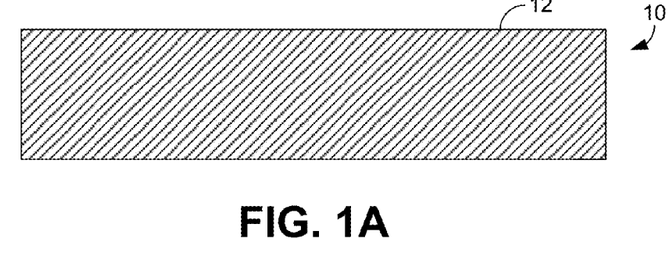
FIGS. 1A-1H are sequential cross-sectional drawings illustrating steps in an embodiment of a method for fabricating a metal-insulator-metal (MIM) tunneling diode.
Figure 1B:
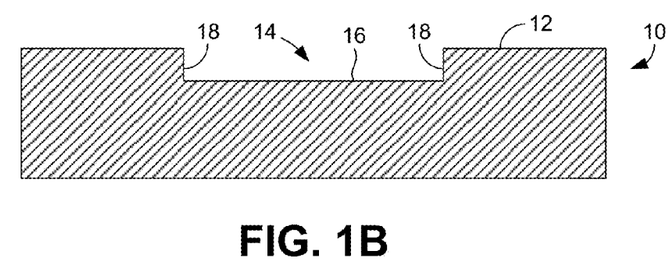
Figure 1C:
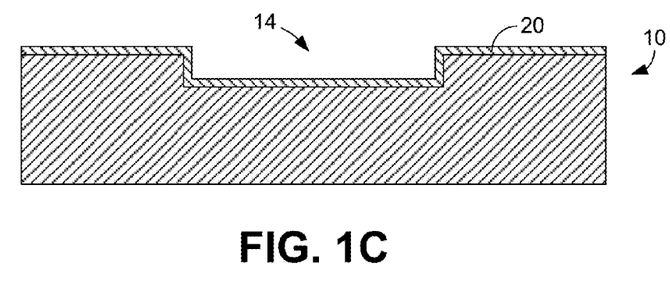
Figure 1D:
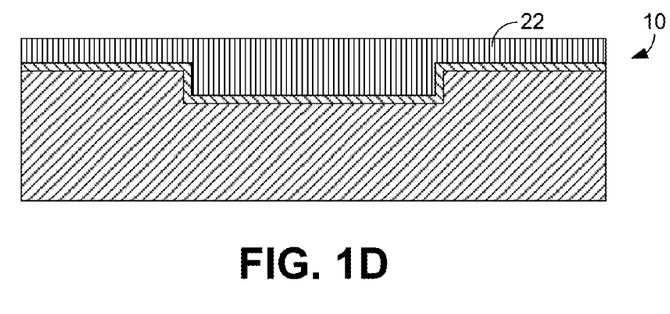
Figure 1E:
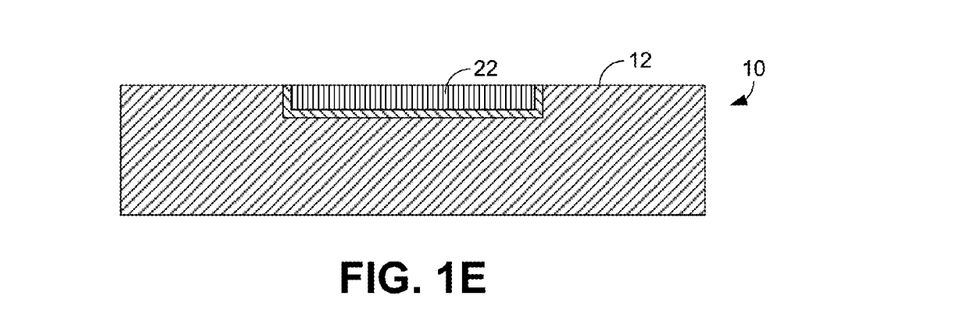
Figure 1F:
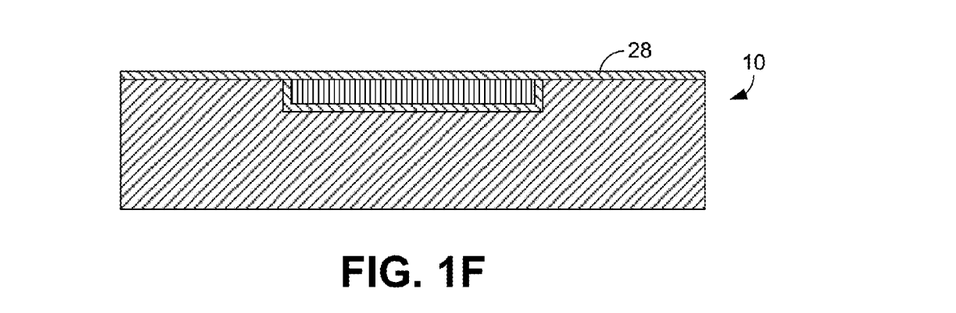
Figure 1G:
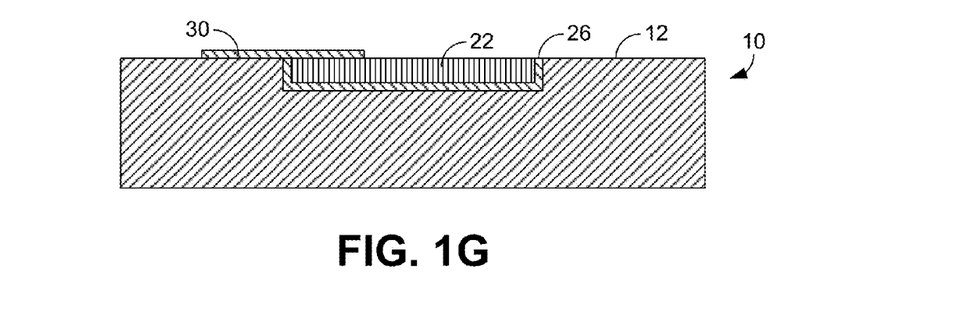
Figure 1H:
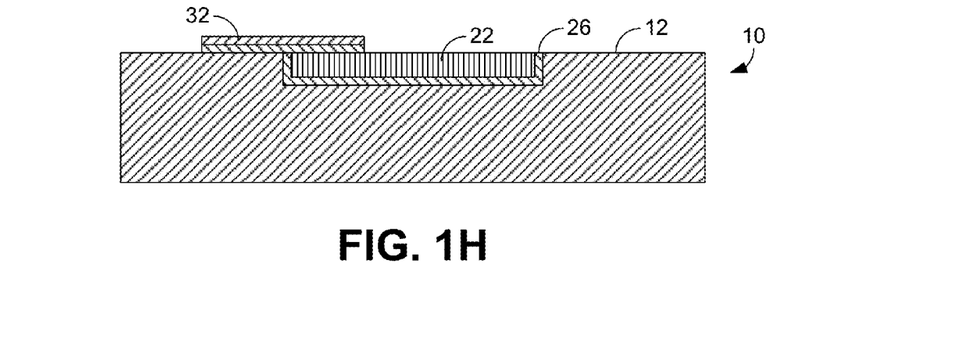
Figure 2A:
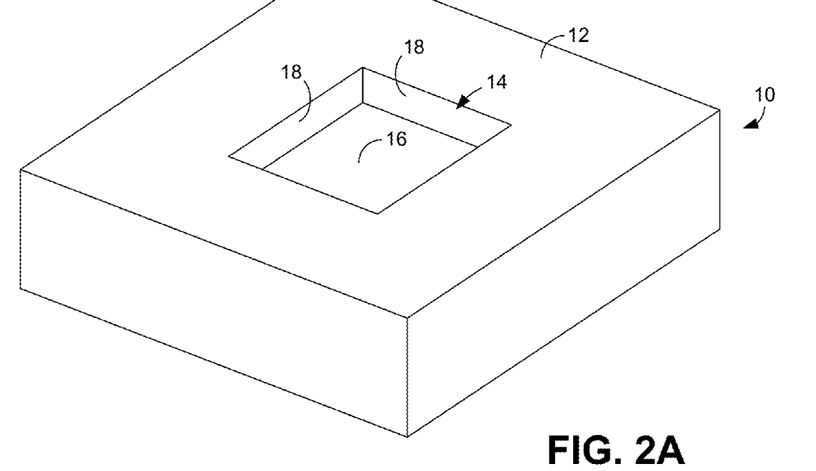
FIGS. 2A-2C are sequential perspective drawings at different stages of the fabrication shown in FIGS. 1A-1H.
Figure 2B:
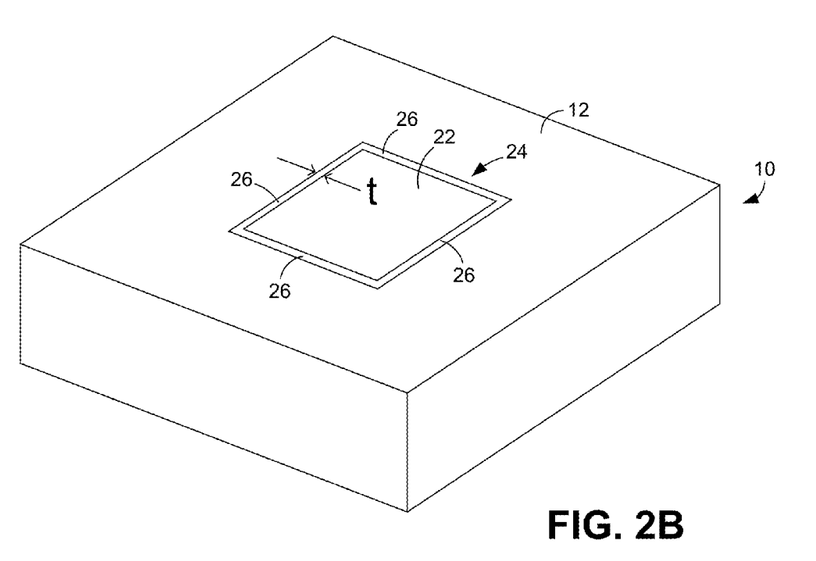
Figure 2C:
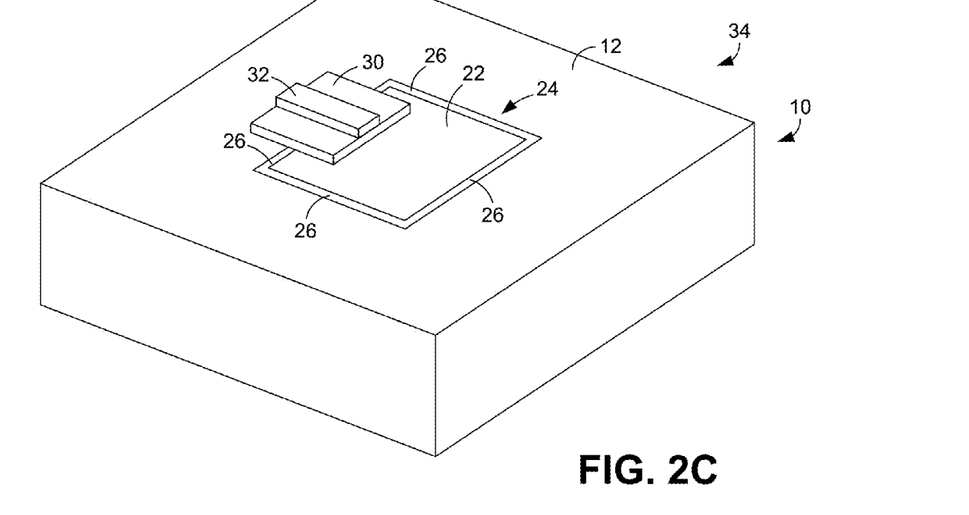

FIGS. 1 and 2 illustrate various stages of an example fabrication method for an MIM tunneling diode. Beginning with FIG. 1A, illustrated is a highly insulating substrate 10 having a top surface 12. By way of example, the substrate 10 comprises a highly resistive silicon wafer or any insulating or semi-insulating substrate (e.g., quartz, glass, GaAs).

Referring next to FIG. 1B, a cavity 14 is formed in the substrate 10. The size of the cavity 14 is not critical for the fabrication of the MIM tunneling diode. By way of example, however, the cavity 14 can be on the order of approximately 10 to 100 μm long, 10 to 100 μm wide, and 1 to 10 μm deep. The cavity 14 is illustrated in perspective view in FIG. 2A. As shown in that figure, the cavity 14 is rectangular and includes a generally horizontal bottom surface 16 and multiple generally vertical walls 18. Irrespective of the specific configuration of the cavity 14, it can be formed using a conventional lithographic process followed by reactive ion etch process (also known as dry etching).

With reference to FIG. 1C, a thin film 20 of metal can be conformally deposited on the top surface 12 of the substrate 10 and in the cavity 14. The thickness of the thin film 20 will dictate the thickness of the bottom electrode of the MIM tunneling diode, so the thin film is preferably very thin. In some embodiments, the thin film 20 is approximately 1 to 100 nm thick. In other embodiments, the thin film 20 is approximately 1 to 10 nm thick. Again, any conventional conformal thin-film deposition process, such as physical vapor deposition (PVD), chemical vapor deposition (CVD), or atomic layer deposition processes (ALD), can be used to deposit the thin film 20. Because the metal is conformally deposited, the thickness of the thin film 20 is generally uniform on the bottom surface 16 and walls 18 of the cavity 14.

The metal that is used to form the thin film 20 can be selected based upon the desired configuration. For an MIM tunneling diode, the metal that is selected for one of the electrodes must have a different work function than the metal selected for the other electrode. Therefore, the metal used to form the thin film 20 will have a different work function than the metal used to form the other electrode (described below). By way of example, the metal used to form the thin film 20 can be platinum, titanium, or nickel.

Next, an insulating material can be deposited that covers the thin film 20 and fills the cavity 14 to serve as an isolation layer 22, as shown in FIG. 1D. In some embodiments, the isolation layer 22 can comprise a layer of amorphous silicon, silicon dioxide or silicon nitride, or parylene or polyimide. By way of example, the isolation layer 22 can be deposited using CVD.

Referring next to FIG. 1E, the isolation layer 22 can be planarized using a polishing process to expose the top edges of the thin film 20 deposited on the walls 18 of the cavity 14. The result of such planarization is shown in the perspective view of FIG. 2B. As shown in this figure, the cavity 14 is filled with the insulating material of the isolation layer 22 and a continuous trace 24 of metal is formed at the surface of the device, flush with the top surface 12 of the substrate 10. The trace 24 comprises four connected metal lines 26, which result from the thin film 20 being applied to the four walls 18 of the cavity 14 (FIG. 2A). Each line 26 can be used to form one or more bottom electrodes of a device, such as an MIM tunneling diode, and each has a width that is equal to the thickness, t, of the thin film 20 that can be repeatedly controlled down to 1 to 10 nm scale.

Next, as shown in FIG. 1F, a very thin dielectric layer 28 of insulating material can be deposited. In some embodiments, the dielectric layer 28 is approximately 1 nm to 10 nm. As noted above, the dielectric layer 28 can itself comprise multiple layers of insulating material, which can, in some cases, be layers of different materials. As with the other deposited layers, the dielectric layer 28 can be deposited using conventional thin film deposition processes, such as PVD, CVD, ALD, or polymer spinning. By way of example, the dielectric layer 28 can comprise one or more oxide layers made of a suitable oxide material (e.g., silicon oxide, $Al_2O_3$, $HfO_2$, $TiO_2$) or one or more polymer layers made of a suitable polymer material (e.g., parylene or polyimide).

Referring next to FIG. 1G, the dielectric layer 28 can be etched to again expose the edges of the thin film 20 to facilitate simple connection with the MIM tunneling diode. An example result of such etching is shown in FIG. 2C. As shown in this figure, the etching can be performed so as to leave a pad 30 of dielectric material that overlies one of the lines 26 of the trace 24 and serves as a tunnel junction area.

With reference next to FIG. 1H, a top electrode 32 can then be formed on the dielectric pad 30 to complete the MIM tunneling diode. As before, conventional lithographic processes can be used to form the electrode 32. For example, the top electrode 32 can be patterned using conventional ultraviolet (UV) photolithography. When such a technique is used, the top electrode 32 can have a width, w, that is approximately 500 nm to 1 μm. As mentioned above, the metal that is selected for one electrode must be one that has a different work function than the metal selected for the other electrode. For example, if the metal used to form the thin film 20 is platinum, the metal used to form the top electrode 32 may be titanium.

Figure 3:
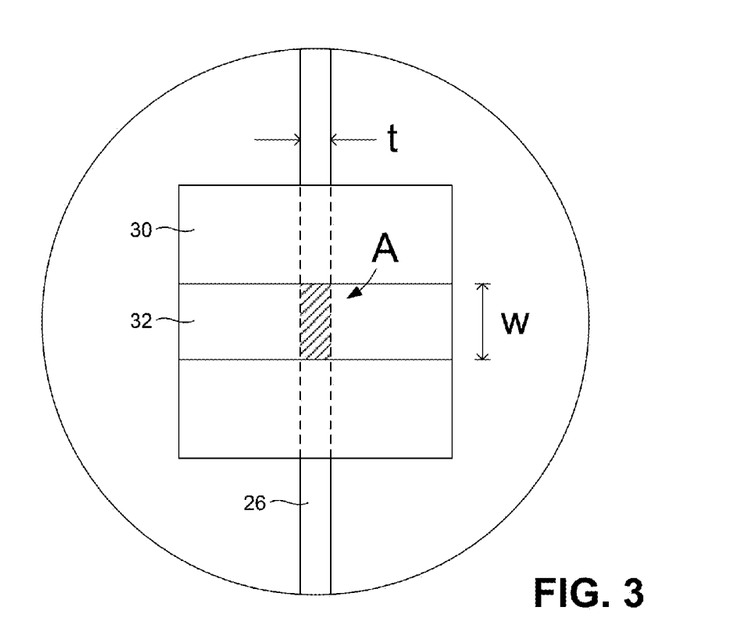
FIG. 3 is a top detail view of the diode of FIG. 2C that identifies the area of a junction of the diode.

The completed MIM tunneling diode 34 is shown in FIG. 2C. As can be appreciated from this figure, the line 26 that is positioned beneath the dielectric pad 30 forms the bottom electrode of the diode 34 and is separated from the top electrode 32 by the dielectric pad 30. The size of the diode's junction is dictated by the overlap of the top and bottom electrodes. In particular, the size is dictated by the area of this overlap. This area, A, is illustrated in the detail view of FIG. 3. As can be appreciated from FIG. 3, the top electrode 32 is relatively wide as compared to the bottom electrode, whose width is dictated by the thickness, t, of the thin film 20. However, because the thin film 20 is so thin (narrow), the area, A, is still small enough to achieve the desired functionality. In some embodiments, the area, A, is approximately 0.01 to 0.1 $\mu m^2$. By way of example, the top electrode 32 can have a width, w, of approximately 1 μm and the thin film 20 can have a thickness, t, of approximately 10 nm. In such a case, the junction will have an area, A, of approximately 0.01 $\mu m^2$. Because the trace 24 is flush with the surface 12 of the substrate 10, it is easy to connect to the line 26. Moreover, as is apparent from FIG. 2C, because the trace 24 includes multiple elongated lines 26, multiple devices can be formed on the surface of the substrate 10, if desired.

Figure 4:
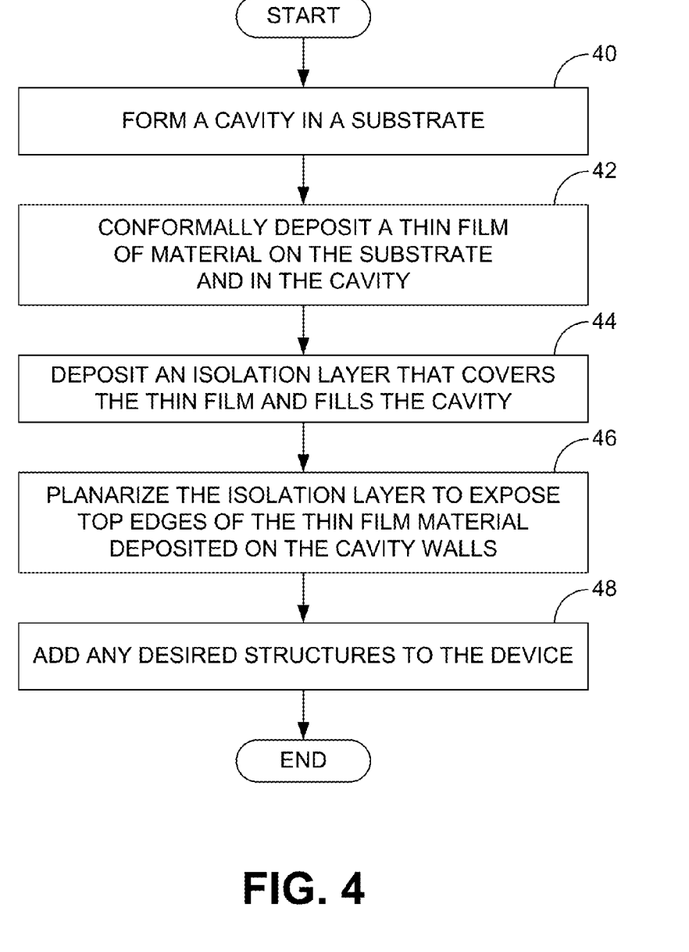
FIG. 4 is a flow diagram of an embodiment of a method for fabricating a device having nanoscale structures, which can be used to fabricate an MIM.

As expressed above, the disclosed fabrication method can be used to manufacture electrical devices other than MIM tunneling diodes. Indeed, the fabrication method can more generally be described as a method for making devices having nanoscale structures with a high aspect ratio. FIG. 4 describes an example of such a method. Beginning with block 40, a cavity is formed in a substrate. Next, a thin film material is conformally deposited on the substrate and in the cavity, as indicated in block 42. In some embodiments, the thin film has a thickness of no more than 100 nm. In other embodiments, the thin film has a thickness of no more than 10 nm. An isolation layer of insulating material that covers the thin film and fills the cavity is then deposited, as indicated in block 44. The isolation layer is then planarized to expose the top edges of the thin film material deposited on the cavity walls, as indicated in block 46. Finally, with reference to block 48, other structures can be added to the device, as desired. Significantly, each of the above-described actions can be performed using conventional lithography processes such that devices can be quickly and inexpensively manufactured in a mass-production context.

Figure 5A:
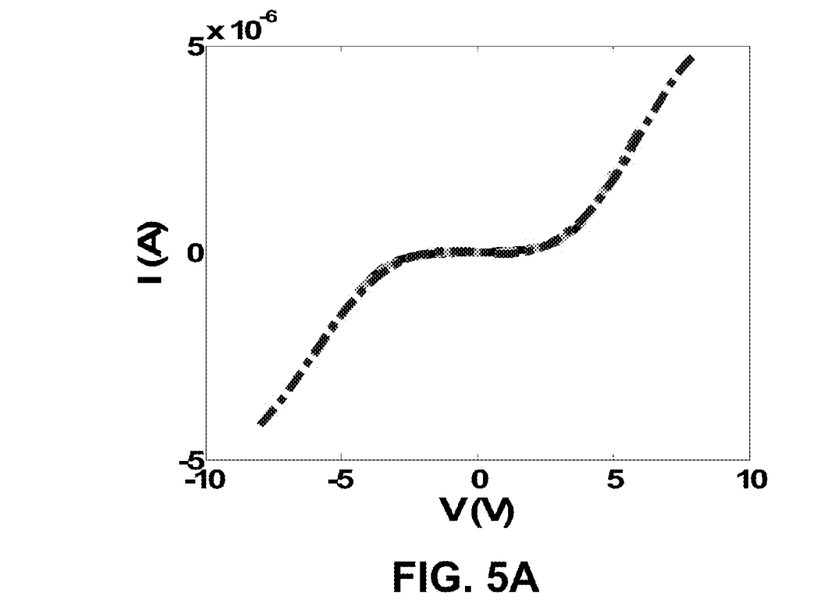
FIGS. 5A and 5B are I-V responses for two MIM tunneling diodes that were fabricated.
Figure 5B:
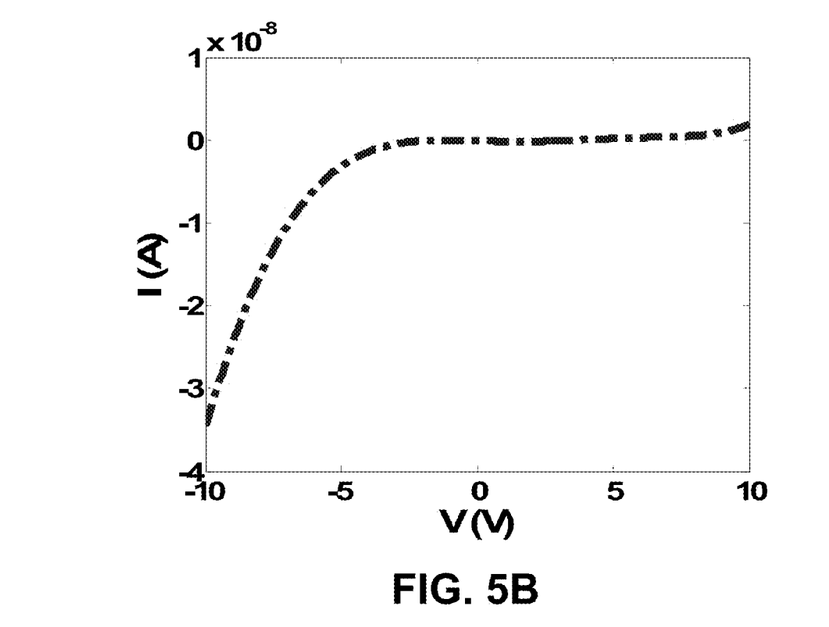

MIM tunneling diodes were fabricated for testing purposes. In particular, two diodes were fabricated, both having a junction area of 200 nm×200 nm. A first diode comprised platinum and titanium electrodes and a 3 nm thick $Al_2O_3$ tunnel junction. The second diode comprised platinum and titanium electrodes and a dual-layer dielectric layer including a 1.5 nm $Al_2O_3$ layer and 1.5 nm $TiO_2$ layer. The I-V responses for the two diodes are shown in FIGS. 5A and 5B, respectively. As can be appreciated from these figures, the dual-layer approach changes the I-V characteristics by making the response much more asymmetric in forward- and reverse-biasing conditions.

The invention claimed is:

1. A method for fabricating a semiconductor device, the method comprising:
   forming a cavity in a substrate having a top surface, the cavity having vertical walls;
   conformally depositing a thin layer of metal in the cavity on the substrate so as to form a metal thin film on the top surface and the walls of the cavity;
   depositing a layer of insulation material on the metal thin film until the cavity is filled with the insulation material; and
   planarizing the insulation material and the metal thin film on the top surface until the substrate is exposed and a top edge of the metal thin film deposited on the vertical walls is exposed and forms multiple exposed metal lines that are flush with the top surface of the substrate and that have substrate material on one side and the insulation material on the other side.

2. The method of claim 1, wherein the width of the exposed metal lines is approximately 1 to 100 nanometers.

3. The method of claim 1, wherein width of the exposed metal lines is approximately 1 to 10 nanometers.

4. The method of claim 1, further comprising depositing a further insulation layer over the substrate, exposed metal lines, and insulation material in the cavity.

5. The method of claim 4, wherein depositing a further insulation layer comprises depositing the further insulation layer using physical vapor deposition (PVD), chemical vapor deposition (CVD), atomic layer deposition processes (ALD), or polymer spinning.

6. The method of claim 4, wherein depositing a further insulation layer comprises depositing silicon oxide, aluminum oxide, hafnium dioxide, or titanium dioxide.

7. The method of claim 4, further comprising etching the further insulation layer to form a dielectric pad that overlaps one of the metal lines.

8. The method of claim 4, further comprising forming a metal electrode on the further insulation layer in a location in which the electrode overlaps one of the metal lines beneath the further insulation layer so as to form a metal-insulator-metal (MIM) tunneling diode in which the metal line is a bottom electrode of the MIM tunneling diode, the further insulation layer is an insulation layer of the MIM tunneling diode, and the metal electrode is a top electrode of the MIM tunneling diode.

9. The method of claim 1, wherein forming a cavity comprises forming the cavity in the substrate using a lithographic process.

10. The method of claim 1, wherein forming a cavity comprises forming the cavity in the substrate using dry etching.

11. The method of claim 1, wherein conformally depositing a thin layer of metal comprise conformally depositing the thin layer of metal using physical vapor deposition (PVD), chemical vapor deposition (CVD), or atomic layer deposition processes (ALD).

12. The method of claim 1, wherein conformally depositing a thin layer of metal comprise conformally depositing a thin layer of platinum, titanium, or nickel.

13. The method of claim 1, depositing a layer of insulation material comprises depositing the layer of insulation material using chemical vapor deposition (CVD).

14. The method of claim 1, wherein depositing a layer of insulation material comprises depositing a layer of amorphous silicon, silicon dioxide, silicon nitride, parylene, or polyimide.

15. The method of claim 1, wherein planarizing the insulation material and the metal thin film comprises polishing the insulation material and the metal thin film.

16. The method of claim 1, wherein the cavity has four vertical walls and wherein four exposed metal lines are formed.

17. The method of claim 16, wherein the metal lines are connected to each other.

* * * * *

UNITED STATES PATENT AND TRADEMARK OFFICE
CERTIFICATE OF CORRECTION

PATENT NO.        : 9,184,308 B1
APPLICATION NO.   : 14/032614
DATED             : November 10, 2015
INVENTOR(S)       : Wu et al.

It is certified that error appears in the above-identified patent and that said Letters Patent is hereby corrected as shown below:

Title Page

Page 1, Delete Item (73) and insert --(73) Assignee: University of South Florida, Tampa, FL--

Signed and Sealed this
Twenty-eighth Day of June, 2016

Michelle K. Lee
*Director of the United States Patent and Trademark Office*